United States Patent
Lee

(10) Patent No.: US 7,205,922 B2
(45) Date of Patent: Apr. 17, 2007

(54) REFERENCE VOLTAGE SUPPLYING CIRCUIT AND ANALOG-TO-DIGITAL CONVERTER EQUIPPED THEREWITH

(75) Inventor: Woo Yol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/373,587

(22) Filed: Mar. 10, 2006

(65) Prior Publication Data

US 2006/0202876 A1    Sep. 14, 2006

(30) Foreign Application Priority Data

Mar. 11, 2005    (KR)    ............ 10-2005-0020726

(51) Int. Cl.
*H03M 1/34* (2006.01)
(52) U.S. Cl. ..................... 341/158; 341/155
(58) Field of Classification Search ......... 341/136–170
See application file for complete search history.

(56) References Cited

U.S. PATENT DOCUMENTS 6,930,630 B1 *   8/2005   Kim et al. ............... 341/155

* cited by examiner

*Primary Examiner*—Rexford Barnie
*Assistant Examiner*—Lam T. Mai
(74) *Attorney, Agent, or Firm*—Lee, Hong, Degerman, Kang & Schmadeka

(57) ABSTRACT

A reference voltage supplying circuit is disclosed, wherein the circuit generates stable maximum reference voltage and minimum reference voltage to a pipeline Analog to Digital Converter (ADC) even if levels of a first reference voltage and a second reference voltage are changed. According to the present invention, the first reference voltage and a maximum feedback voltage are differentially amplified by a first operational amplifier, and the second reference voltage and a minimum feedback voltage are differentially amplified by a second operational amplifier. Furthermore, a feedback voltage generator generates a maximum feedback voltage and a minimum feedback voltage in response to output signals from the first and second operational amplifiers and feedbacks the voltages to the first and second operational amplifiers, such that if the first and second reference voltages are changed, the maximum and minimum feedback voltages are changed to enable the first and second operational amplifiers to output stable signals. A reference voltage generator is operated in response to the output signals from the first and second operational amplifiers to generate stable maximum and minimum reference voltages.

16 Claims, 5 Drawing Sheets

REFERENCE VOLTAGE SUPPLYING CIRCUIT AND ANALOG-TO-DIGITAL CONVERTER EQUIPPED THEREWITH

Pursuant to 35 U.S.C. § 119(a), this application claims the benefit of earlier filing date and right of priority to Korean Application No. 2005-0020726, filed on Mar. 11, 2005, the contents of which is hereby incorporated by reference herein in its entirety.

BACKGROUND

This description relates to a reference voltage supplying circuit and an analog to digital converter (ADC) equipped therewith. More particularly, the present invention relates to an ADC mounted with a reference voltage supplying circuit for supplying a stable minimum reference voltage and a maximum reference voltage to a pipeline ADC for converting an analog signal to a digital signal, and a reference voltage supplying circuit for converting an analog signal to a digital signal by the minimum reference voltage and the maximum reference voltage supplied by the reference voltage supplying circuit.

Concomitant with development of various flat display panels such as Plasma Display Panels (PDPs) and Liquid Crystal Displays (LCDs), markets for image display devices using flat display panels have made a sudden growth. Image signals which the image display devices can display on a screen using the flat display panels are varied. For example, the image display devices can receive various kinds of analog image signals including component signals of NTSC method, luminance and color signals, R, G, B signals and Y, PB, PR signals to display on a screen. The image display devices using flat display panels convert analog image signals to digital image signals and scale them to fit to the size of a screen in order to display a variety of analog image signals on the screen.

Furthermore, the processing speed of the ADC for converting the analog image signals to digital image signals should be heightened as the image display devices display the image signals of high resolution on the screen.

However, if the processing speed of the ADC is increased, there occurs a distortion of image signals, and the distortion of the image signals attenuates contrast and brightness of the images displayed on the screen. Accordingly, if the analog image signals are converted to the digital image signals, care should be taken into account that the image signals are not distorted even though the processing speed increases.

Pipeline ADCs are known for ADCs for converting analog image signals to digital image signals at a high speed without generating distortion to the image signals. The pipeline ADC is divided into a plurality of stages for converting analog signals to digital signals. Each stage is operated under the same timing, and results of each stage are turned over to next stage.

Consequently, the pipeline ADC is capable of converting the analog signals to the digital signals at a very high speed, and also capable of providing a wide variety of dynamic ranges relative to high frequency signals.

The pipeline ADC includes a plurality of flash ADCs and a plurality of MDACs (Multiplying Digital to Analog Converters). If reference voltages supplied to the plurality of flash ADCs and the plurality of MDACs are unstably varied, gain errors and offset errors occur to the digital signals converted from the analog signals. As a result, in designing a pipeline ADC, it is one of the most important elements to stabilize the reference voltage.

SUMMARY

In one general aspect, a reference voltage supplying circuit comprises: a first operational amplifier for operationally amplifying a first reference voltage and a maximum feedback voltage; a second operational amplifier for operationally amplifying a second reference voltage and a minimum feedback voltage; a feedback voltage generator for generating the maximum feedback voltage and the minimum feedback voltage responsive to output signals from the first and second operational amplifiers to feedback the voltages to the first and second operational amplifiers; and a reference voltage generator for generating a maximum reference voltage and a minimum reference voltage responsive to the output signals from the first and second operational amplifiers.

In another general aspect, a pipeline ADC equipped with a reference voltage supplying circuit comprises: a Sampling and Holding Amplifier (SHA) for sampling and holding an analog signal; a reference voltage generating circuit for generating a maximum reference voltage and a minimum reference voltage; a pipeline ADC for converting the analog signal outputted by the SHA to a digital signal based on the reference voltage generated by the reference voltage generating circuit; and a Digital Correction Logic (DCL) for correcting an error of the digital signal outputted by the pipeline ADC, wherein the reference voltage supplying circuit comprises: a first operational amplifier for operationally amplifying a first reference voltage and maximum feedback voltage; a second operational amplifier for operationally amplifying a second reference voltage and a minimum feedback voltage; a feedback voltage generator for generating the maximum feedback voltage and the minimum feedback voltage responsive to the first and second operational amplifiers to feedback the voltages to the first and second operational amplifiers; and a reference voltage generator for generating a maximum reference voltage and a minimum reference voltage responsive to output signals from the first and second operational amplifiers.

DETAILED DESCRIPTION OF THE INVENTION

Figure 1:
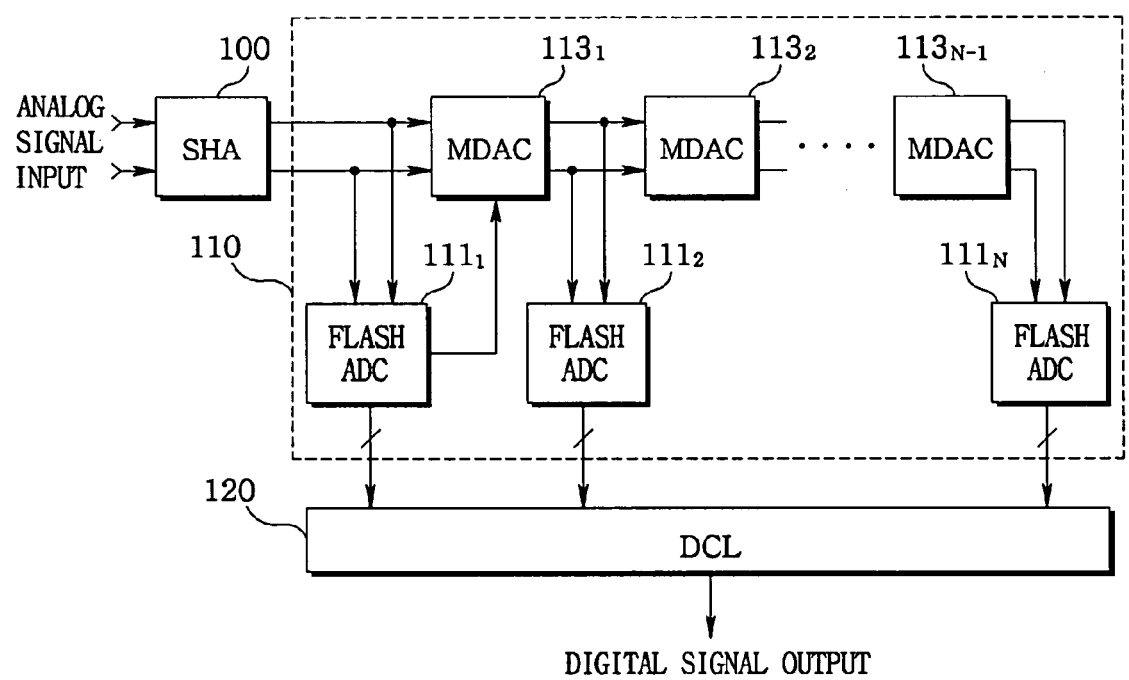
FIG. 1 is a block diagram illustrating a construction of a conventional ADC.

FIG. 1 is a block diagram illustrating a construction of a conventional ADC, where reference numeral 100 is a sampling and holding amplifier (SHA). The SHA 100 serves to sample an analog signal received from outside in response to a clock signal, and hold, amplify and output the sampled analog signal. The analog signal outputted by the SHA 100 is converted to a digital signal by a pipeline Analog to Digital Converter (ADC) 110.

The pipeline ADC 110 includes a plurality of flash ADCs ($111_1$, $111_2$, ..., $111_N$), and a plurality of MDACs ($113_1$, $113_2$, ..., $113_{N-1}$). The plurality of flash ADCs ($111_1$, $111_2$, ..., $111_N$) disposed at the pipeline ADC 110 converts only the analog signal of a predetermined level to a digital signal of a predetermined bit based on a maximum reference voltage and a minimum reference voltage in the analog signals outputted from the SHA 100 and the plurality of MDACs ($113_1$, $113_2$, ..., $113_{N-1}$).

Furthermore, each flash ADC ($111_1$, $111_2$, ..., $111_{N-1}$) informs of the plurality of MDACs ($113_1$, $113_2$, ..., $113_{N-1}$) the analog signal of a predetermined level converted to the digital signal.

Each MDAC ($113_1$, $113_2$, ..., $113_{N-1}$) deducts from each signal outputted from the SHA 100 and the plurality of flash ADCs ($111_1$, $111_2$, ..., $111_{N-1}$) a predetermined level in which the plurality of flash ADCs ($111_1$, $111_2$, ..., $111_{N-1}$) are converted to the digital signals, and levels remaining after the deduction are expanded to the scope of the maximum reference voltage and the minimum reference voltage and outputted to the plurality of flash ADCs ($111_2$, $111_3$, ..., $111_N$).

The digital signals respectively outputted from the plurality of flash ADCs ($111_1$, $111_2$, ..., $111_N$) are inputted to a DCL (Digital Correction Logic.120), where the DCL (Digital Correction Logic.120) corrects errors of the digital signals inputted from the plurality of flash ADCs ($111_1$, $111_2$, ..., $111_N$) and outputs the digital signal digitally converted from the analog signal.

In the pipeline ADC, the plurality of flash ADCs ($111_1$, $111_2$, ..., $111_N$) convert the analog signals to digital signals based on the inputted reference maximum voltage and the minimum reference voltage. Furthermore, Each MDAC ($113_1$, $113_2$, ..., $113_{N-1}$) also extends levels of the outputted signals to those of maximum reference voltage and minimum reference voltage and outputs them.

If the levels of the maximum reference voltage and the minimum reference voltage supplied to the plurality of flash ADCs ($111_1$, $111_2$, ..., $111_N$) and the plurality of MDACs ($113_1$, $113_2$, ..., $113_{N-1}$) are changed, there occur gain errors and offset errors at the digital signals.

Therefore, the plurality of flash ADCs ($111_1$, $111_2$, ..., $111_N$) and the plurality of MDACs ($113_1$, $113_2$, ..., $113_{N-1}$) should be supplied with maximum reference voltage and minimum reference voltage of change-free, stable and accurate levels to thereby enable to change the analog signal to digital signal accurately.

Figure 2:
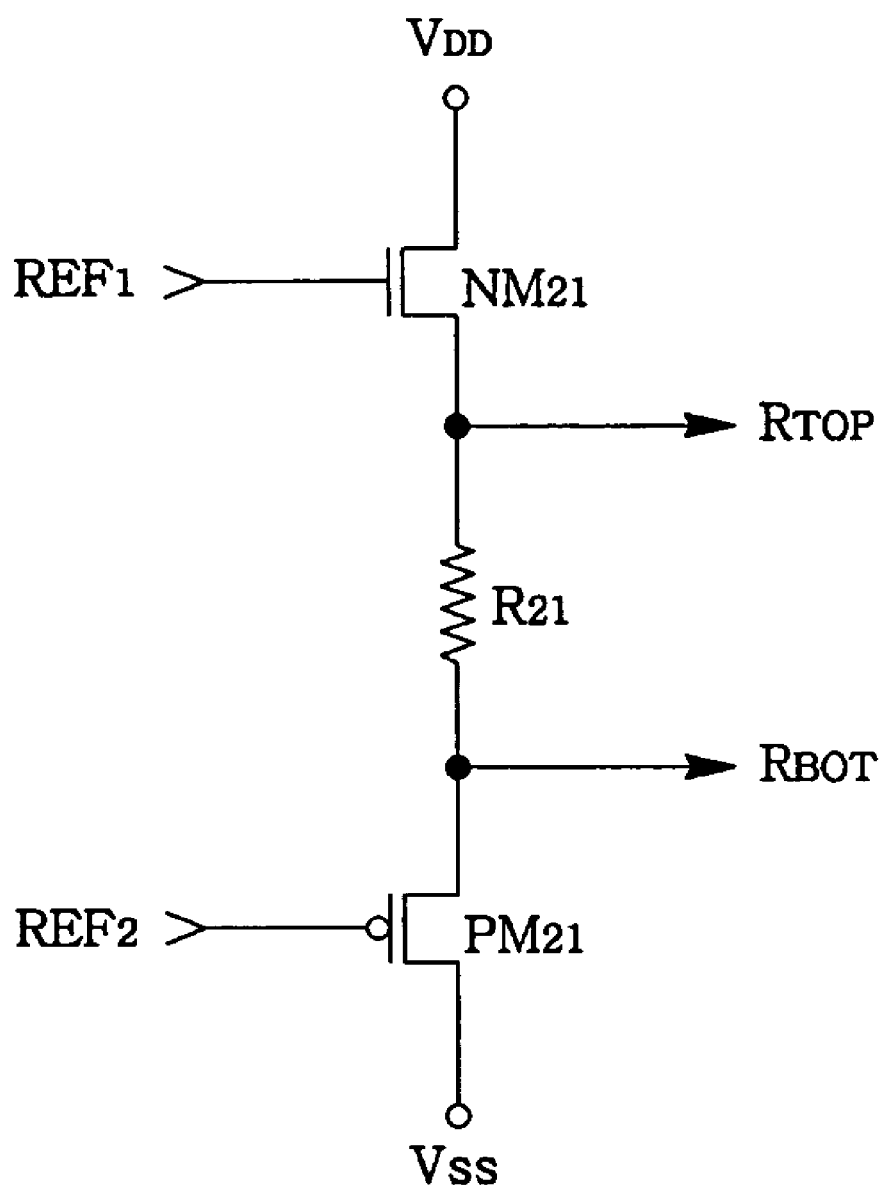
FIG. 2 is a circuit diagram illustrating a construction of a reference voltage supplying circuit.

FIG. 2 is a circuit diagram illustrating a construction of a reference voltage supplying circuit where a maximum reference voltage ($R_{TOP}$) and a minimum reference voltage ($R_{BOT}$) are supplied to the plurality of flash ADCs ($111_1$, $111_2$, $111_N$) and the plurality of MDACs ($113_1$, $113_2$, ..., $113_{N-1}$).

Referring to FIG. 2, a first reference voltage ($REF_1$) supplied from outside is applied to a gate of an N-channel MOS transistor (hereinafter the MOS transistor is simply referred to as "MOST" and the N-channel MOS transistor as "NMOST". $NM_{21}$) Furthermore, a second reference voltage ($REF_2$) is applied to a gate of PMOS (hereinafter the MOS transistor is simply referred to as "MOST" and the P-channel MOS transistor as "PMOST". $PM_{21}$).

Furthermore, between a first power source terminal ($V_{DD}$) and a second power source terminal ($V_{SS}$), the NMOST ($NM_{21}$), a resistor ($R_{21}$) and the PMOST ($PM_{21}$) are connected in series. The reference voltage supply circuit thus constructed is such that a predetermined level of operating power source is applied to the first ($V_{DD}$) and the second power source terminal ($V_{SS}$). Under this circumstance, the first reference voltage ($REF_1$) and the second reference voltage ($REF_2$) supplied from outside are respectively applied to gates of the NMOST ($NM_{21}$) and the PMOST ($PM_{21}$).

Thereafter, the NMOST ($NM_{21}$) and the PMOST ($PM_{21}$) are turned on and a current flows from the first power source terminal ($V_{DD}$) to the second power source terminal ($V_{SS}$) sequentially via the NMOST ($NM_{21}$), the resistor ($R_{21}$) and the PMOST ($PM_{21}$). As a result, a voltage drop occurs at the resistor ($R_{21}$) according to the current.

A voltage at a connection point between the NMOST ($NM_{21}$) and the resistor ($R_{21}$) is supplied as the maximum reference voltage ($R_{TOP}$) to the plurality of flash ADCs ($111_1$, $111_2$, ..., $111_N$) and the plurality of MDACs ($113_1$, $113_2$, ..., $113_{N-1}$). Furthermore, a voltage at a connection point between the resistor ($R_{21}$) and the PMOST ($PM_{21}$) is supplied as the minimum reference voltage ($R_{BOT}$) to the plurality of flash ADCs ($111_1$, $111_2$, ..., $111_N$) and the plurality of MDACs ($113_1$, $113_2$, ..., $113_{N-1}$).

At this time, the level of the current flowing to the NMOST ($NM_{21}$) and the PMOST ($PM_{21}$) are adjusted responsive to the levels of the first reference voltage ($REF_1$) and the second reference voltage ($REF_2$) to thereby enable to adjust output levels of the maximum reference voltage ($R_{TOP}$) and the minimum reference voltage ($R_{BOT}$).

The reference voltage supplying circuit is such that the levels of the first reference voltage ($REF_1$) and the second reference voltage ($REF_2$) applied to the gates of the NMOST ($NM_{21}$) and the PMOST ($PM_{21}$) can be instantly adjusted responsive to the environmental changes such as temperature changes.

Under the circumstance, levels of the maximum reference voltage ($R_{TOP}$) and the minimum reference voltage ($R_{BOT}$) outputted by the reference voltage supplying circuit can be instantly changed. Consequently, stable maximum reference voltage ($R_{TOP}$) and minimum reference voltage ($R_{BOT}$) to the plurality of flash ADCS ($111_1$, $111_2$, ..., $111_N$) and the plurality of MDACS ($113_1$, $113_2$, ..., $113_{N-1}$) disposed at the pipeline ADC (110).

If the maximum reference voltage ($R_{TOP}$) and minimum reference voltage ($R_{BOT}$) are not stabilized, gain errors and offset errors are generated in the course of converting the analog signal to the digital signal. Still worse, because the analog signal is not changed to digital signal, it is inevitable to have a bad picture quality when an image signal is displayed on a screen.

In order to prevent the maximum reference voltage ($R_{TOP}$) and minimum reference voltage ($R_{BOT}$) from changing, a separate condenser may be connected to an outside of integrated devices of the pipeline ADC. However, this method calls for a separate pin for connecting a condenser to an integrated device, and a substrate may be enlarged according to the connection of the condenser, and manufacturing cost of the product increases to the detriment of price competition.

Figure 3:
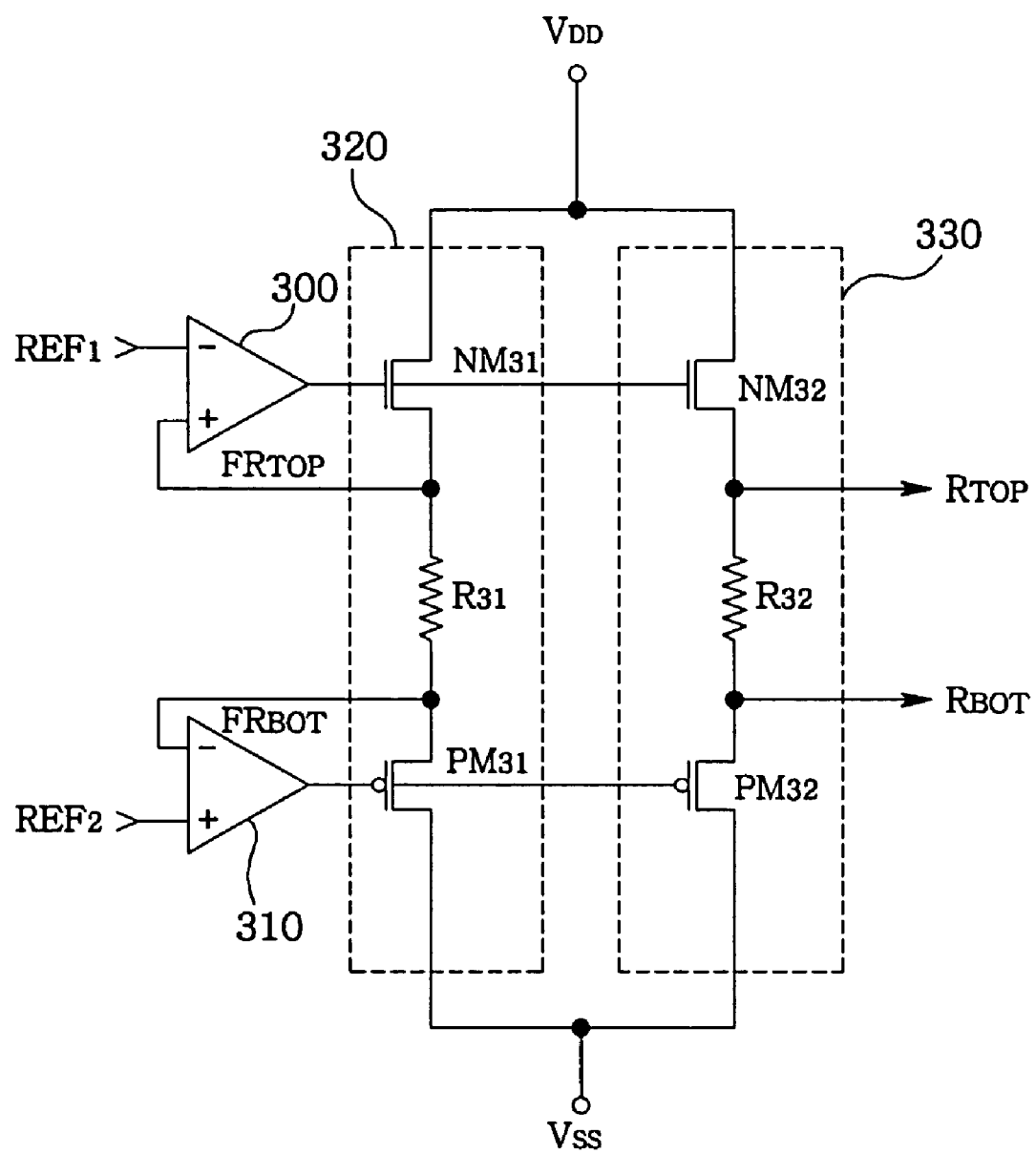
FIG. 3 is a circuit diagram illustrating a construction of one embodiment of a reference voltage supplying circuit.

FIG. 3 is a circuit diagram illustrating a construction of one embodiment of a reference voltage supplying circuit.

Referring to FIG. 3, a reference voltage supplying circuit according to the present invention comprises: first and second operational amplifiers (300,310); a feedback voltage generator (320): and a reference voltage generator (330).

An reverse input terminal (−) of the first operational amplifier (300) is inputted with a first reference voltage ($REF_1$), and a non-inverse terminal (+) of the second operational amplifier (310) is inputted with a second reference voltage ($REF_2$).

The feedback voltage generator (320) is such that between power source terminals ($V_{DD}$) (Vss), an NMOST ($NM_{31}$), a resistor ($R_{31}$) and a PMOST ($PM_{31}$) are connected in series. Furthermore, output terminals of the first and second operational amplifiers (300, 310) are respectively connected to gates of the NMOST ($NM_{31}$) and the PMOST ($PM_{31}$). A connection point between the NMOST ($NM_{31}$) and the resistor ($R_{31}$) is connected to the non-inverse input terminal (+) of the first operational amplifier (300). A connection point between the resistor ($R_{31}$) and the PMOST ($PM_{31}$) is connected to an inverse input terminal of the second operational amplifier (310).

The reference voltage generator (330) is such that between power source terminals ($V_{DD}$) (Vss), an NMOST ($NM_{32}$), a resistor ($R_{32}$) and a PMOST ($PM_{32}$) are connected in series. Furthermore, output terminals of the first and second operational amplifiers (300, 310) are respectively connected to gates of the NMOST ($NM_{32}$) and the PMOST ($PM_{32}$). A voltage at a connection point between the NMOST ($NM_{32}$) and the resistor ($R_{32}$) is supplied as the maximum reference voltage ($R_{TOP}$) to the plurality of flash ADCs ($111_1$, $111_2$, . . . , $111_N$) and the plurality of MDACs ($113_1$, $113_2$, . . . , $113_{N-1}$). Furthermore, a voltage at a connection point between the resistor ($R_{31}$) and the PMOST ($PM_{31}$) is supplied as the minimum reference voltage ($R_{BOT}$) to the plurality of flash ADCs ($111_1$, $111_2$, . . . , $111_N$) and the plurality of MDACS ($113_1$, $113_2$, . . . , $113_{N-1}$).

In the embodiment of the reference voltage supplying circuit according to the present invention thus constructed, an reverse input terminal (−) of the operational amplifier (300) is inputted with a first reference voltage ($REF_1$), and a non-inverse terminal (+) of the operational amplifier (300) is inputted with a maximum feedback voltage ($FR_{TOP}$) while an operational power source is applied to the power source terminals ($V_{DD}$) (Vss).

Thereafter, the first operational amplifier (300) operationally amplifies the first reference voltage ($REF_1$) and the maximum feedback voltage ($FR_{TOP}$), and an output signal of the first operational amplifier (300) is applied to a gate of the NMOST ($NM_{31}$) of the feedback voltage generator (320). As a result, the NMOST ($NM_{31}$) is turned on in response to level of signal outputted by the operational amplifier (300). Furthermore, the second operational amplifier (310) operationally amplifies a second reference voltage ($REF_2$) and the minimum feedback voltage ($FR_{TOP}$), and an output signal of the second operational amplifier (310) is applied to a gate of the PMOST ($PM_{31}$) of the feedback voltage generator (320). As a result, the PMOST ($PM_{31}$) is turned on in response to level of signal outputted by the operational amplifier (310).

If the NMOST ($NM_{31}$) and the PMOST ($PM_{31}$) are turned on, a current flows from the power source terminal ($V_{DD}$) to the power source terminal (Vss) sequentially via the NMOST ($NM_{31}$), the resistor ($R_{31}$) and the PMOST ($PM_{31}$).

Under the circumstance, level of the output signal from the first operational amplifier (300) is changed in response to the level change of the first reference voltage ($REF_1$) if the level of the first reference voltage ($REF_1$) is changed responsive to environmental changes such temperature changes to thereby change the level of a current flowing to the NMOST ($NM_{31}$). As a result, the maximum feedback voltage ($FR_{TOP}$) fedback to the first operational amplifier (300) is changed, and the level of output signal from the first operational amplifier (300) maintains a constant level regardless of the level change of the first reference voltage ($REF_1$).

Furthermore, if there is any change of level of the second reference voltage ($REF_2$), level of output signal from the second operational amplifier (310) is changed responsive to the level change of the second reference voltage ($REF_2$) to thereby change the level of current flowing to the PMOST ($PM_{31}$). Consequently, a minimum feedback voltage ($FR_{BOT}$) fedback to the second operational amplifier (310) is changed, and level of output signal from the second operational amplifier (310) maintains a constant level regardless of the level changes.

The output signals of the first and second operational amplifiers (300, 310) thus mentioned as maintaining a constant level are applied to gates of the NMOST ($NM_{32}$) and the PMOST ($PM_{32}$) of the reference voltage generator (330). As a result, the NMOST ($NM_{32}$) and the PMOST ($PM_{32}$) of the reference voltage generator (330) are all turned on. If the NMOST ($NM_{32}$) and the PMOST ($PM_{32}$) of the reference voltage generator (330) are all turned on, a constant level of current flows from the power source terminal ($V_{DD}$) to the power source terminal (Vss) sequentially via the NMOST ($NM_{32}$), the resistor ($R_{32}$) and the PMOST ($PM_{32}$).

Consequently, the reference voltage generator (330) outputs stable maximum reference voltage ($R_{TOP}$) and minimum reference voltage ($R_{BOT}$) regardless of the level changes of the first reference voltage ($REF_1$) and the second reference voltage ($REF_2$) and supplies them to the plurality of flash ADCs ($111_1$, $111_2$, . . . , $111_N$) and the plurality of MDACs ($113_1$, $113_2$, . . . , $113_{N-1}$).

Figure 4:
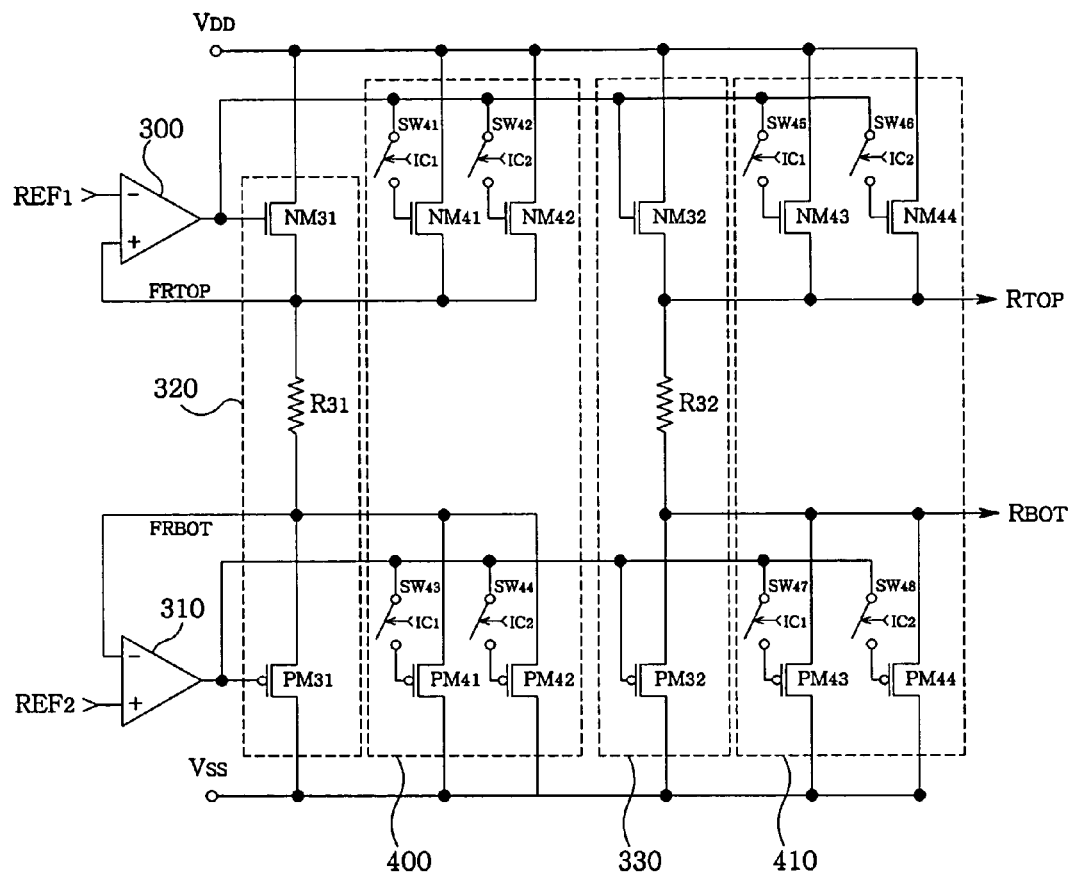
FIG. 4 is a circuit diagram illustrating a construction of another embodiment of a reference voltage supplying circuit.

FIG. 4 is a circuit diagram illustrating a construction of another embodiment of a reference voltage supplying circuit. Referring to FIG. 4, said another embodiment of the present invention is such that a feedback current increaser (400) and a reference current increaser (410) are added to the embodiment of FIG. 3.

The feedback current inceaser (400) is such that the NMOST ($NM_{31}$) is connected with a plurality of NMOSTS ($NM_{41}$, $NM_{42}$) in parallel, and the PMOST ($PNM_{31}$) is connected with a plurality of PMOSTs ($PM_{41}$, $PM_{42}$). Between the output terminal of the first operational amplifier (300) and the gate of the plurality of NMOSTs ($NM_{41}$, $NM_{42}$), there are respectively connected with a plurality of first switching elements ($SW_{41}$, $SW_{42}$). Control terminals of the plurality of switching elements are respectively supplied with a plurality of current control signals ($IC_1$) ($IC_2$). Furthermore, between the output terminal of the second operation amplifier (310) and the plurality of plurality of PMOSTs ($PM_{41}$, $PM_{42}$), there are respectively connected with a plurality of second switching elements ($SW_{43}$, $SW_{44}$). Control terminals of the plurality of second switching elements ($SW_{43}$, $SW_{44}$) are respectively supplied with the plurality of current control signals ($IC_1$) ($IC_2$).

The reference current increaser (410) is such that the NMOST ($NM_{32}$) is respectively connected with a plurality of NMOSTs ($NM_{43}$, $NM_{44}$) in parallel, and the PMOST ($PM_{32}$) is respectively connected with a plurality of PMOSTs ($PM_{43}$, $PM_{44}$) in parallel. Furthermore, between the output terminal of the first operational amplifier (300) and the gates of the plurality of NMOSTs ($NM_{43}$, $NM_{44}$), there are respectively connected with a plurality of third switching elements (($SW_{45}$, $SW_{46}$). Between the output terminal of the second operation amplifier (310) and the plurality of plurality of PMOSTs ($PM_{43}$, $PM_{44}$), there are respectively connected with a plurality of fourth switching elements ($SW_{47}$, $SW_{48}$). Control terminals of the plurality of fourth switching elements ($SW_{47}$, $SW_{48}$) are respectively supplied with the plurality of current control signals ($IC_1$) ($IC_2$).

In said another embodiment of the present invention thus constructed, current levels of the maximum reference voltage ($R_{TOP}$) and the minimum reference voltage ($R_{BOT}$) can be varied in response to a process speed for changing an analog signal to a digital signal.

In case the process speed for changing the analog signal to the digital signal is slow, even if low current levels of the maximum reference voltage ($R_{TOP}$) and the minimum reference voltage ($R_{BOT}$) are supplied, an analog signal can be changed to a digital signal. However, if the process speed for changing the analog signal to the digital signal is fast, sufficient current levels of the maximum reference voltage ($R_{TOP}$) and the minimum reference voltage ($R_{BOT}$) should be supplied.

In other words, the plurality of flash ADCs ($111_1$, $111_2$, . . . , $111_N$) and the plurality of MDACs ($113_1$, $113_2$, . . . , $113_{N-1}$) disposed at the pipeline ADC should be supplied with current levels of the maximum reference voltage ($R_{TOP}$) and the minimum reference voltage ($R_{BOT}$) that are changed in proportion to the process speed for changing the analog signal to the digital signal.

In order to meet this condition, said another embodiment of the present invention is configured in such a manner that only one single control signal ($IC_1$) or a plurality of current control signals ($IC_1$) ($IC_2$) are inputted responsive to the process speed for changing the analog signal to the digital signal to switch the first to fourth switching elements ($SW_{41}$~$SW_{48}$).

At this time, the plurality of current control signals ($IC_1$) ($IC_2$) may be set up in advance by an operator manufacturing an image display device in response to the process speed of the pipeline ADC (110). Or, a controller (not shown) for controlling an image display device may be operated according to a predetermined program to generate the plurality of current control signals ($IC_1$) ($IC_2$).

If the current control signal ($IC_1$) is inputted at a high potential level, all the first to fourth switching elements ($SW_{41}$, $SW_{43}$, $SW_{45}$, $SW_{47}$) are connected. Then, the output signal of the first operational amplifier (300) is applied to the gates of NMOSTs ($NM_{41}$, $NM_{43}$) via the first and third switching elements ($SW_{41}$, $SW_{45}$) such that a predetermined level of current flows to the NMOSTs ($NM_{41}$, $NM_{43}$).

Accordingly, the maximum feedback voltage ($FR_{TOP}$) fedback to the first operational amplifier (300) increases, and the current level of the maximum reference voltage ($R_{TOP}$) supplied to the plurality of flash ADCs ($111_1$, $111_2$, . . . , $111_N$) and the plurality of MDACs ($113_1$, $113_2$, . . . , $113_{N-1}$) increase. Furthermore, the output signal of the second operational amplifier (310) is applied to the gates of the PMOSTs ($PM_{41}$, $PM_{43}$) via the second and fourth switching elements ($SW_{43}$, $SW_{47}$) such that a predetermined level of current flows to the PMOSTs ($PNM_{41}$, $PNM_{47}$). Accordingly, the minimum feedback voltage (FRbot) fedback to the second operational amplifier (310) increases, and the current level of the minimum reference voltage (Rbot) supplied to the plurality of flash ADCs ($111_1$, $111_2$, . . . , $111_N$) and the plurality of MDACs ($113_1$, $113_2$, . . . , $113_{N-1}$) increase.

If all the current control signals ($IC_1$) ($IC_2$) are inputted at a high potential level, the first to fourth switching elements ($SW_{41}$~$SW_{48}$) are all connected. Accordingly, a predetermined level of current flows to the NMOSTs ($NM_{41}$, $NM_{44}$) and the PMOSTs ($PM_{41}$, $PM_{44}$) in response to the levels of the output signals from the first and second operational amplifiers (300, 310). Therefore, the maximum feedback voltage ($FR_{TOP}$) and the minimum feedback voltage (FRbot) fedback to the first and second operational amplifiers (300, 310) increase, and the current levels of the maximum reference voltage ($R_{TOP}$) and the minimum reference voltage (Rbot) supplied to the plurality of flash ADCs ($111_1$, $111_2$, . . . , $111_N$) and the plurality of MDACs ($113_1$, $113_2$, . . . , $113_{N-1}$) further increase.

Figure 5:
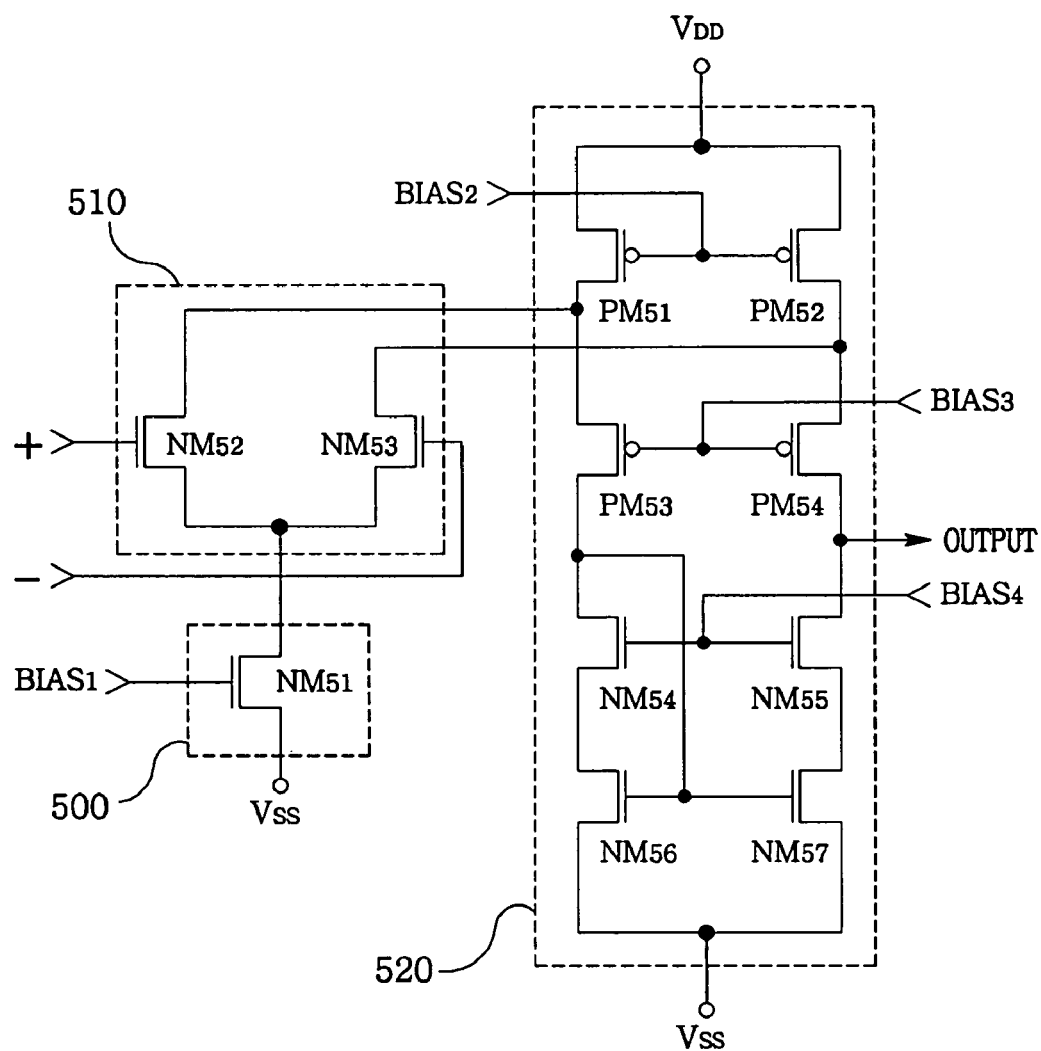
FIG. 5 is a detailed circuit diagram illustrating an inner construction of operational amplifiers used in the reference voltage supplying circuit.

FIG. 5 is a detailed circuit diagram illustrating an inner construction of the first and second operational amplifiers used in the reference voltage supplying circuit.

Referring to FIG. 5, the first and second operational amplifiers (300, 310) include a constant current source (500), a differential amplifier (510) and a folded cascode amplifier (520).

The constant current source (500) operates in such a fashion that an NMOST ($NM_{51}$) is turned on in response to a first bias voltage ($BIAS_1$) to allow a current to flow from the differential amplifier (510) to the power source terminal ($V_{SS}$).

A constant current flows in the differential amplifier (510) by the constant current source (500), and the differential amplifier (510) differentially amplifies input signals of an reverse input terminal (−) and a non-inverse terminal (+) by way of NMOSTs ($NM_{52}$, $NM_{53}$).

The folded cascade amplifier (520) is such that between the power source terminals ($V_{DD}$) (Vss), PMOSTs ($PM_{51}$, $PM_{53}$) and NMOSTs ($NM_{54}$, $NM_{56}$), and PMOSTs ($PM_{52}$, $PM_{54}$) and NMOSTs ($NM_{55}$, $NM_{57}$) are respectively connected in series. Gates of the PMOSTs ($PM_{51}$, $PM_{53}$) are supplied with a second bias voltage ($BIAS_2$). Gates of the PMOSTs ($PM_{51}$, $PM_{53}$) are supplied with a third bias voltage ($BIAS_3$). Gates of NMOSTs ($NM_{54}$, $NM_{55}$) are supplied with a fourth bias voltage ($BIAS_4$). A connection point between the PMOST ($PM_{53}$) and the NMOST ($NM_{54}$) is connected to gates of the NMOSTs ($NM_{56}$, $NM_{57}$). A connection point between the PMOSTs ($PM_{51}$, $PM_{53}$), and a connection point between the PMOSTs ($PM_{52}$, $PM_{54}$) are respectively connected with an output terminal of the differential amplifier (510). An output signal is outputted from a connection point between the PMOST ($PM_{54}$) and the NMOST ($NM_{55}$).

The first and second operational amplifiers (300, 310) thus constructed operate in such a manner that a predetermined level of constant current flows to the NMOST ($NM_{51}$) of the constant current source (500) responsive to the first bias voltage ($BIAS_1$) while operational power source is applied to the power source terminals ($V_{DD}$) (Vss), thereby allowing a constant current flow to the differential amplifier (510).

Under this state, a predetermined level of signal is inputted to the reverse input terminal (−) and a non-inverse terminal (+). Then, the differential amplifier (510) differentially amplifies the signal inputted into the reverse input terminal (−) and a non-inverse terminal (+), and an output signal from the differential amplifier (510) is inputted into the folded cascode amplifier (520), cascode-amplified and outputted.

The first and second operational amplifiers (300, 310) differentially amplify the signals of the reverse input terminal (−) and a non-inverse terminal (+) by way of the differential amplifier (510), and the output signal of the differential amplifier (510) is again amplified and outputted by the folded cascade amplifier (520), such that stable maximum reference voltage ($R_{TOP}$) and the minimum reference voltage (Rbot) can be supplied to the plurality of flash ADCs ($111_1$, $111_2$, . . . , $111_N$) and the plurality of MDACs ($113_1$, $113_2$, . . . , $113_{N-1}$) with high gain and at a high speed.

As erstwhile mentioned, the present invention can compensate even if first and second reference voltages are instantaneously changed, and stable and level-change free maximum reference voltage and minimum reference voltage are generated and supplied to a pipeline ADC. Therefore, even if the pipeline ADC converts an analog signal to a digital signal at a high speed, gain errors and offset errors are not created to enable to accurately convert the analog signal to the digital signal.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A reference voltage supplying circuit comprising: a first operational amplifier for operationally amplifying a first reference voltage and a maximum feedback voltage; a second operational amplifier for operationally amplifying a second reference voltage and a minimum feedback voltage; a feedback voltage generator for generating the maximum feedback voltage and the minimum feedback voltage responsive to output signals from the first and second operational amplifiers to feedback the voltages to the first and second operational amplifiers; and a reference voltage generator for generating a maximum reference voltage and a minimum reference voltage responsive to the output signals from the first and second operational amplifiers.

2. The circuit as defined in claim 1, wherein the first and second operational amplifiers respectively comprise: a constant current source in which a constant current flows responsive to a first bias voltage; a differential amplifier in which a constant current flows by the constant current source and differentially amplifying input signals of an reverse input terminal and a non-inverse terminal; and a folded cascade amplifier for cascade-amplifying an output signal of the differential amplifier.

3. The circuit as defined in claim 1, wherein the feedback voltage generator operates in such a fashion that between first and second power source terminals, a first NMOST, a resistor and a first PMOST are connected in series to each other, and gates of the first NMOST and a first PMOST are connected with output terminals of the first and second operational amplifiers, so that the maximum feedback voltage is generated from a connection point between the first NMOST and the resistor, and a minimum feedback voltage is generated from a connection point between the resistor and the first PMOST.

4. The circuit as defined in claim 1, wherein the reference voltage generator operates in such a manner that between first and second power source terminals, a second NMOST, a resistor and a second PMOST are connected in series to each other, and gates of the second NMOST and a second PMOST are connected with output terminals of the first and second operational amplifiers, so that the maximum feedback voltage is generated from a connection point between the second NMOST and the resistor, and a minimum feedback voltage is generated from a connection point between the resistor and the second PMOST.

5. The circuit as defined in claim 1 further comprising: a feedback current increaser for increasing current levels of the maximum feedback voltage and the minimum feedback voltage fedback to the first and second operational amplifiers in response to output signals of the first and second operational amplifiers and a plurality of current control signals; a reference current increaser for increasing current levels of the maximum reference voltage and minimum reference voltage in response to the output signals of the first and second operational amplifiers and the plurality of current control signals.

6. The circuit as defined in claim 5, wherein the feedback current increaser comprises: one or more first and second switching elements for respectively switching the output signals of the first and second operational amplifiers in response to a plurality of current control signals; one or more NMOSTs for increasing a current level of the maximum feedback voltage in response to a signal switched by one or more first switching elements; and one or more PMOSTs for increasing a current level of the minimum feedback voltage in response to a signal switched by one or more second switching element.

7. The circuit as defined in claim 5, wherein the reference current increaser comprises: one or more third and fourth switching elements for respectively switching the output signals of the first and second operational amplifiers in response to a plurality of current control signals; one or more NMOSTs for increasing a current level of the maximum reference voltage in response to a signal switched by one or more third switching elements; and one or more PMOSTs for increasing a current level of the minimum reference voltage in response to a signal switched by one or more fourth switching element.

8. A pipeline ADC equipped with a reference voltage supplying circuit comprising: a Sampling and Holding Amplifier (SHA) for sampling and holding an analog signal; a reference voltage generating circuit for generating a maximum reference voltage and a minimum reference voltage; a pipeline ADC for converting the analog signal outputted by the SHA to a digital signal based on the reference voltage generated by the reference voltage generating circuit; and a Digital Correction Logic (DCL) for correcting an error of the digital signal outputted by the pipeline ADC, wherein the reference voltage supplying circuit comprises: a first operational amplifier for operationally amplifying a first reference voltage and maximum feedback voltage; a second operational amplifier for operationally amplifying a second reference voltage and a minimum feedback voltage; a feedback voltage generator for generating the maximum feedback voltage and the minimum feedback voltage responsive to the first and second operational amplifiers to feedback the voltages to the first and second operational amplifiers; and a reference voltage generator for generating a maximum reference voltage and a minimum reference voltage responsive to output signals from the first and second operational amplifiers.

9. The ADC as defined in claim 8, wherein the SHA amplifies the held analog signal and outputs it to the pipeline ADC.

10. The ADC as defined in claim 8, wherein the first and second operational amplifiers respectively comprise: a constant current source in which a constant current flows responsive to a first bias voltage; a differential amplifier in which a constant current flows by the constant current source and differentially amplifying input signals of an reverse input terminal and a non-inverse terminal; and a folded cascade amplifier for cascade-amplifying an output signal of the differential amplifier.

11. The ADC as defined in claim 8, wherein the feedback voltage generator operates in such a fashion that between first and second power source terminals, a first NMOST, a resistor and a first PMOST are connected in series to each other, and gates of the first NMOST and a first PMOST are connected with output terminals of the first and second operational amplifiers, so that the maximum feedback voltage is generated from a connection point between the first NMOST and the resistor, and a minimum feedback voltage is generated from a connection point between the resistor and the first PMOST.

12. The ADC as defined in claim 8, wherein the reference voltage generator operates in such a manner that between first and second power source terminals, a second NMOST, a resistor and a second PMOST are connected in series to each other, and gates of the second NMOST and a second PMOST are connected with output terminals of the first and second operational amplifiers, so that the maximum feedback voltage is generated from a connection point between the second NMOST and the resistor, and a minimum feedback voltage is generated from a connection point between the resistor and the second PMOST.

13. The ADC as defined in claim 8 further comprising: a feedback current increaser for increasing current levels of the maximum feedback voltage and the minimum feedback voltage fedback to the first and second operational amplifiers in response to output signals of the first and second operational amplifiers and a plurality of current control signals; a reference current increaser for increasing current levels of the maximum reference voltage and minimum reference voltage in response to the output signals of the first and second operational amplifiers and the plurality of current control signals.

14. The ADC as defined in claim 13, wherein the feedback current increaser comprises: one or more first and second switching elements for respectively switching the output signals of the first and second operational amplifiers in response to a plurality of current control signals; one or more NMOSTs for increasing a current level of the maximum feedback voltage in response to a signal switched by one or more first switching elements; and one or more PMOSTs for increasing a current level of the minimum feedback voltage in response to a signal switched by one or more second switching element.

15. The ADC as defined in claim 13, wherein the reference current increaser comprises: one or more third and fourth switching elements for respectively switching the output signals of the first and second operational amplifiers in response to a plurality of current control signals; one or more NMOSTs for increasing a current level of the maximum reference voltage in response to a signal switched by one or more third switching elements; and one or more PMOSTs for increasing a current level of the minimum reference voltage in response to a signal switched by one or more fourth switching element.

16. The ADC as defined in claim 8 further comprising: a plurality of MDACs connected to an output terminal of the SHA in series to each other, and deducting a level converted to a digital signal from the level of the input signal, and expanding the level remaining after the deduction to the level scopes of the maximum reference voltage and the minimum reference voltage; and a plurality of flash ADCs converting only the signal of a predetermined level to a digital signal of a predetermined bit from output signals of the SHA and the plurality of MDACs based on the maximum reference voltage and the minimum reference voltage, and outputting the level of signal not converted to the digital signal to the plurality of MDACs.

* * * * *